US012740305B2

(12) United States Patent
Li

(10) Patent No.: US 12,740,305 B2
(45) Date of Patent: Sep. 15, 2026

(54) METHOD OF MANUFACTURING FLEXIBLE SUBSTRATE

(71) Applicant: Shenzhen China Star Optoelectronics Semiconductor Display Technology Co., Ltd., Shenzhen (CN)

(72) Inventor: Linshuang Li, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 147 days.

(21) Appl. No.: 18/676,403

(22) Filed: May 28, 2024

(65) Prior Publication Data

US 2024/0315123 A1 Sep. 19, 2024

Related U.S. Application Data

(63) Continuation of application No. 17/055,564, filed as application No. PCT/CN2020/113367 on Sep. 4, 2020, now Pat. No. 12,041,843.

(30) Foreign Application Priority Data

Aug. 10, 2020 (CN) ........................ 202010797696.0

(51) Int. Cl.
*B29C 65/00* (2006.01)
*H10K 77/10* (2023.01)
(Continued)

(52) U.S. Cl.
CPC ............ *H10K 77/111* (2023.02); *B29C 65/48* (2013.01); *B29C 65/4855* (2013.01); *B29C 65/50* (2013.01);
(Continued)

(58) Field of Classification Search
CPC ..... B29C 65/48; B29C 65/4855; B29C 65/50; B29C 65/72; B29C 65/76
See application file for complete search history.

(56) References Cited

U.S. PATENT DOCUMENTS 7,085,444 B2 * 8/2006 Bermel ................. G02B 26/02 345/32
2011/0062444 A1 3/2011 Park et al.
(Continued)

FOREIGN PATENT DOCUMENTS

CN 103531724 A 1/2014
CN 106206945 A 12/2016
(Continued)

OTHER PUBLICATIONS

Chinese Office Action issued in corresponding Chinese Patent Application No. 202010797696.0 dated Mar. 3, 2022, pp. 1-16.
(Continued)

*Primary Examiner* — Philip C Tucker
*Assistant Examiner* — Nickolas R Harm
(74) *Attorney, Agent, or Firm* — PV IP PC; Christopher S. Ruprecht; Wei Te Chung

(57) ABSTRACT

Disclosed is a method of manufacturing a flexible substrate. The method includes: forming a first flexible substrate on a glass substrate; forming a porous film layer on the first flexible substrate; forming a second flexible substrate on the porous film layer, wherein the porous film layer is configured to increase adhesion between the first flexible substrate and the second flexible substrate; and separating the first flexible substrate from the glass substrate.

15 Claims, 2 Drawing Sheets

(51) Int. Cl.

| | |
|---|---|
| *B29C 65/48* | (2006.01) |
| *B29C 65/50* | (2006.01) |
| *B29C 65/72* | (2006.01) |
| *B29C 65/76* | (2006.01) |
| *H10K 102/00* | (2023.01) |

(52) U.S. Cl.

CPC .............. *B29C 65/72* (2013.01); *B29C 65/76* (2013.01); *H10K 2102/311* (2023.02)

(56) References Cited

U.S. PATENT DOCUMENTS

| | | | | |
|---|---|---|---|---|
| 2011/0221578 | A1* | 9/2011 | Sekiguchi | G06K 19/0704 340/10.42 |
| 2013/0118556 | A1* | 5/2013 | Kim | H02S 20/26 136/251 |
| 2013/0209780 | A1* | 8/2013 | Poxson | C23C 16/487 204/192.1 |
| 2015/0123748 | A1* | 5/2015 | Stevenson | H01P 7/088 156/289 |
| 2015/0314576 | A1* | 11/2015 | Sun | B32B 27/10 428/221 |

FOREIGN PATENT DOCUMENTS

| | | | |
|---|---|---|---|
| CN | 206077834 | U | 4/2017 |
| CN | 107805464 | A | 3/2018 |
| CN | 108531094 | A | 9/2018 |
| CN | 111430301 | A | 7/2020 |
| KR | 20150012815 | A | 2/2015 |
| WO | 2017179797 | A1 | 10/2017 |
| WO | 2019233734 | A1 | 12/2019 |

OTHER PUBLICATIONS

Chinese Office Action issued in corresponding Chinese Patent Application No. 202010797696.0 dated Jul. 19, 2022, pp. 1-6.

Chinese Rejection Decision issued in corresponding Chinese Patent Application No. 202010797696.0 dated Oct. 31, 2022, pp. 1-5.

International Search Report in International application No. PCT/CN2020/113367, mailed on Apr. 27, 2021.

Written Opinion of the International Search Authority in International application No. PCT/CN2020/113367, mailed on Apr. 27, 2021.

The Advances on Polyimide/Inorganic Hybride Films Sep. 30, 2006 Xue Shukai, etc. Xi'an Aerospace composites Research Institute, Xi'an 710025.

* cited by examiner

METHOD OF MANUFACTURING FLEXIBLE SUBSTRATE

CROSS-REFERENCE TO RELATED APPLICATIONS

This application is a continuation application of U.S. application Ser. No. 17/055,564, filed on Nov. 14, 2020, which is a US national phase application based upon an International Application No. PCT/CN2020/113367, filed on Sep. 4, 2020, which claims priority to Chinese Patent Application No. 202010797696.0 filed on Aug. 10, 2020. The entire disclosures of the above applications are incorporated herein by reference.

TECHNICAL FIELD

The present disclosure relates to a technical field of displays, and particularly to, a flexible substrate and a method of manufacturing the same, and an electronic device.

BACKGROUND

Flexible substrates are one of the most key components in display panels. Currently, a dual layer flexible substrate is used as a flexible substrate. Even if a lower flexible substrate is damaged during a laser lift-off (LLO) process, an upper flexible substrate can also function as a flexible substrate.

However, due to strong rigid structures in molecular chains of the flexible substrates and interface inertness of the dual layer flexible substrates, bonding force of the dual layer flexible substrates is caused to be not ideal. In repeated high and low temperature manufacturing processes of display panels, there is a risk that adhesion between the duel layer flexible substrates will be reduced, which will cause upper flexible substrates and lower flexible substrates to separate or even fall off, seriously adversely affecting process stability of the display panels and stripping yields of the flexible substrates.

SUMMARY

The present disclosure is to provide a flexible substrate and a method of manufacturing the same, and an electronic device.

In some embodiments, a flexible substrate includes a first flexible substrate; a porous film layer disposed on the first flexible substrate; and a second flexible substrate disposed on the porous film layer. The porous film layer is configured to increase adhesion between the first flexible substrate and the second flexible substrate.

In some embodiments, an electronic device includes the above-mentioned flexible substrate.

In some embodiments, a method of manufacturing a flexible substrate, includes: forming a first flexible substrate on a glass substrate; forming a porous film layer on the first flexible substrate; forming a second flexible substrate on the porous film layer, wherein the porous film layer is configured to increase adhesion between the first flexible substrate and the second flexible substrate; and separating the first flexible substrate from the glass substrate.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present disclosure, and a person skilled in the art may still derive other drawings from these accompanying drawings without creative efforts.

DETAILED DESCRIPTION

Figure 1:
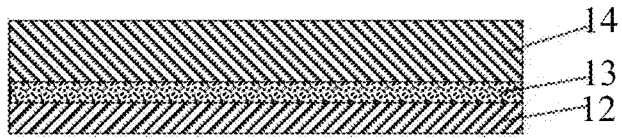
FIG. 1 is a cross-sectional view of a flexible substrate according to some embodiments of the present disclosure.

The technical solutions in the embodiments of the present disclosure will be clearly and completely described in the following with reference to the accompanying drawings in the embodiments. Apparently, the embodiments as described are only a part, but not all, of the embodiments of the present disclosure. Based on the embodiments in the present disclosure, all other embodiments obtained by those skilled in the art without creative efforts shall be within the scope of the present disclosure.

In the description of the present disclosure, it is to be understood that the term "center", "longitudinal", "lateral", "length", "width", "thickness", "upper", "lower", "front", "rear", "left", "right", "vertical", "horizontal", "top", "bottom", "inner", "outer", "clockwise", "counterclockwise" and the like indicates orientation or the orientation or positional relationship based on the positional relationship shown in the drawings, for convenience of description only and the present disclosure is to simplify the description, but does not indicate or imply that the device or element referred to must have a particular orientation in a particular orientation construction and operation, and therefore not be construed as limiting the present disclosure. Moreover, the terms "first" and "second" and the like are used for descriptive purposes only and are not to be construed as indicating or implying relative importance. Thus, features defining "first" or "second" may include one or more of the described features either explicitly or implicitly. In the description of the present disclosure, the meaning of "a plurality" is two or more unless specifically and specifically defined otherwise.

In the present disclosure, unless otherwise explicitly specified or limited, the terms "mounted", "linked", "connected", and like terms are to be broadly understood. For example, it may be a fixed connection, a detachably connection, or an integrally connection, or may be a mechanical connection, electrically connection, or a directly connection. Alternatively, it can also be connected indirectly through intervening structures, or may be interaction between the two internal communicating elements or two elements. For those of ordinary skill in the art, the specific meaning of the above terms in this disclosure can be understood according to the specific situation.

In the present disclosure, unless otherwise expressly specified or limited, the first feature being "on" or "lower" the second feature may include direct contact of the first and the second features and may also include that the first and the second features are not in direct contact, but in contact by the additional features therebetween. Also, the first feature being "on", "above", "upper" the second feature may include that the first feature is obliquely upward, directly above the second feature, or simply represent that a level of the first feature is higher than that of the second feature. The first feature being "beneath", "below" and "lower" the second feature may include that the first feature is obliquely downward and right below the second feature, or simply represent that a level of the first feature is less than that of the second feature.

The following disclosure provides many different embodiments or examples to achieve different structures of the present disclosure. To simplify the disclosure of the present disclosure, the components and configuration of specific examples are described hereinafter. Of course, they are only illustrative, and are not intended to limit the present disclosure. Further, the present disclosure may repeat reference numerals in different embodiments and/or the reference letters. This repetition is for the purpose of simplicity and clarity, and does not indicate a relationship between the various embodiments and/or set in question. Further, the present disclosure provides various specific examples of materials and processes, but one of ordinary skill in the art may be appreciated that other processes and disclosures and/or other materials.

Please refer to FIG. 1. FIG. 1 is a cross-sectional view of a flexible substrate provided by an embodiment of the present disclosure.

As shown in FIG. 1, in one embodiment, a flexible substrate 10 includes a first flexible substrate 12, a porous film layer 13, and a second flexible substrate 14.

The first flexible substrate 12 may be made of yellow polyimide (YPI). Yellow polyimide (YPI) has excellent heat resistance and very low coefficient of thermal expansion (CTE), so it has become the preferred material for flexible substrates. Certainly, it can be understood that the material of the first flexible substrate 12 is not limited to this. In one embodiment, in order to further increase adhesion between the first flexible substrate 12 and the second flexible substrate 14, a thickness of the first flexible substrate 12 is less than 10 microns (μm).

The porous film layer 13 is disposed on the first flexible substrate 12. The porous film layer 13 is configured to increase adhesion between the first flexible substrate 12 and the second flexible substrate 14. In a preferable embodiment, in order to increase adhesion between the first flexible substrate 12 and the second flexible substrate 14, the porous film layer 13 is made of a material including polyimide/inorganic nanohybrid material. Certainly, it can be understood that the material of the porous film layer 13 is not limited to this. In one embodiment, the inorganic nanohybrid material includes at least one of titanium dioxide and silicon dioxide. In one embodiment, in order to increase adhesion between the first flexible substrate 12 and the second flexible substrate 14, the porous film layer 13 has a molecular chain structure including ether bonds and siloxane segments. In one embodiment, the porous film layer 13 has a heat-resistant temperature greater than 500° C. to prevent damage from a high temperature manufacturing process. In one embodiment, in order to increase adhesion between the first flexible substrate 12 and the second flexible substrate 14, the porous film layer 13 has a porosity greater than 50%. In one embodiment, the porous film layer 13 has a thickness less than five μm, so that not only can the adhesion between the first flexible substrate 12 and the second flexible substrate 14 be improved, but also an increase in a thickness of the flexible substrate can be avoided.

The second flexible substrate 14 is disposed on the porous film layer 13, and has a thickness greater than a thickness of the first flexible substrate 12. The second flexible substrate 14 may be made of yellow polyimide (YPI), but is not limited thereto.

Since the porous film layer 13 is added between the first flexible substrate 12 and the second flexible substrate 14, the adhesion between the first flexible substrate 12 and the second flexible substrate 14 is increased, thereby avoiding a risk of separation or even fall off of a dual layer flexible substrate during a manufacturing process, and improving process stability of a display panel and a stripping yield of a flexible substrate.

Figure 2:
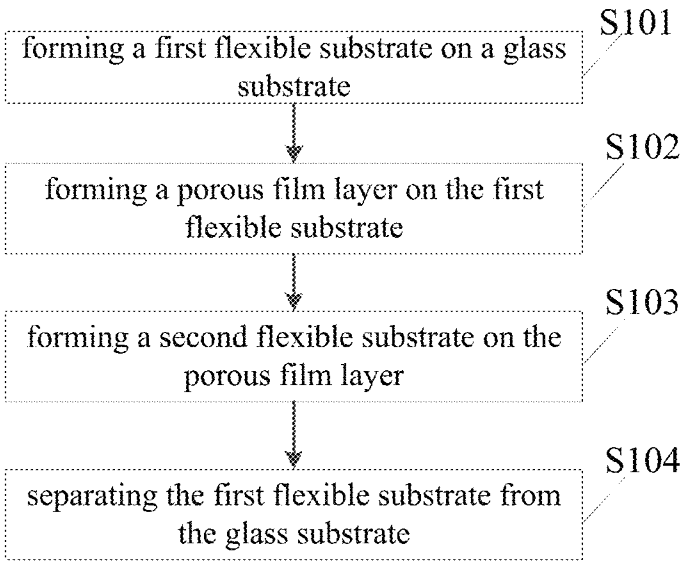
FIG. 2 is a flowchart of a method of manufacturing a flexible substrate according to some embodiments of the present disclosure.
Figure 3:
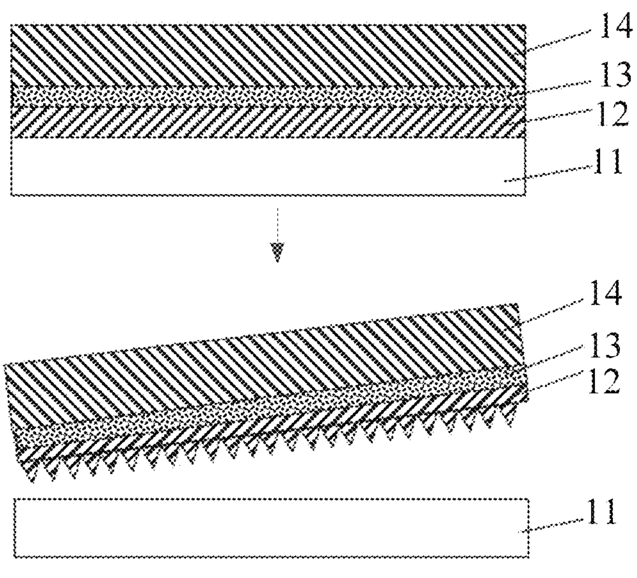
FIG. 3 is a process flow diagram illustrating a method of manufacturing a flexible substrate according to some embodiments of the present disclosure.

In one embodiment, as shown in FIGS. 2 and 3, the present disclosure further provides a method of manufacturing a flexible substrate. The method includes steps as follows:

S101: forming a first flexible substrate on a glass substrate.

A glass substrate 11 can be a soda lime silicate glass, and upper and lower surfaces of the glass substrate are plain glass plates with flat surfaces. A specific material of the glass substrate 11 is not limited.

For example, the first flexible substrate 12 may be formed by thermal imidization of polyamic acid, but a specific preparation method is not limited to this. In one embodiment, in order to avoid damage to the first flexible substrate 12, the first flexible substrate 12 is prepared under a glass transition temperature greater than 500° C., and/or under a glass transition temperature is less than 3 parts per million (ppm)/° C. In one embodiment, the first flexible substrate 12 may have a thickness less than 10 μm.

S102: forming a porous film layer on the first flexible substrate.

The porous film layer 13 is configured to increase adhesion between the first flexible substrate 12 and the second flexible substrate 14.

In one embodiment, a material of the porous film layer 13 is coated on the first flexible substrate 12, and the coating material is pre-heated to facilitate a subsequent pre-curing process, and the pre-curing process is implemented at a temperature lower than 200° C. A curing rate of the porous film layer 13 after curing is about 50%.

The porous film layer 13 may be formed on the first flexible substrate 12 through slot die coating technique. Certainly, a specific preparation method is not limited to this. In one embodiment, the porous film layer 13 is made of a material including polyimide/inorganic nanohybrid material. The inorganic nanohybrid material may include at least one of titanium dioxide and silicon dioxide. Certainly, the material of the porous film layer 13 is not limited thereto.

In one embodiment, in order to avoid damage to the porous film layer and to improve stability of the flexible substrate, the porous film layer 13 may have a heat-resistance temperature greater than 500° C. In one embodiment, there may be highly flexible ether bonds and siloxane segments in the molecular chain structure of the porous film layer 13. In one embodiment, the siloxane segments with low surface free energy diffuse to a surface of the first flexible substrate 12 to increase adhesion between the porous film layer 13 and the first flexible substrate 12. Since the pre-cured porous film layer 13 has a great number of porous structures, molecular chains of the second flexible substrate 14 can penetrate the porous film layer 13 during a curing process, so that adhesion between the porous film layer 13 and the second flexible substrate 14 is significantly increased. In one embodiment, in order to increase adhesion between the porous film layer 13 and the second flexible substrate 14, the porous film layer 13 has a porosity greater than 50%.

S103: forming a second flexible substrate on the porous film layer.

In one embodiment, yellow polyimide may be coated on the porous film layer 13 and cured simultaneously with the pre-cured porous film layer 13 to obtain the second flexible substrate 14. That is, while the porous film layer 13 is cured, the second flexible substrate 14 is also cured, thereby simplifying a manufacturing process. In order to improve curing effects, in one embodiment, a curing temperature may be greater than 400° C. A curing method can be thermal curing.

Specifically, a thickness of the porous film layer 13 after curing may be less than 5 μm.

In one embodiment, the second flexible substrate 14 may have a thickness greater than that of the first flexible substrate 12, and the thickness of the second flexible substrate 14 is less than 20 μm.

S104: separating the first flexible substrate from the glass substrate.

For example, the first flexible substrate can be separated from the glass substrate 11 by a laser lift off (LLO) method. Certainly, a specific separation method is not limited to this.

Figure 4:
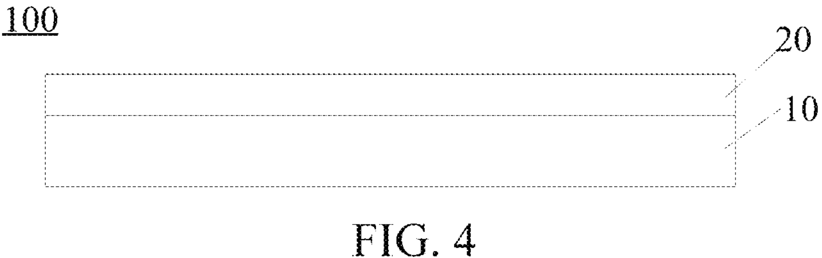
FIG. 4 is a schematic structural view of a display panel according to some embodiments of the present disclosure.

As shown in FIG. 4, the present disclosure further provides a display panel 100, including any one of the flexible substrates 10 as described above. In addition, the display panel further includes a display portion 20 disposed on the flexible substrate 10. The display portion 20 includes a plurality of subpixels, which may be organic light-emitting diodes. The display panel 100 may be an organic light-emitting diode display panel or a liquid crystal display panel.

Figure 5:
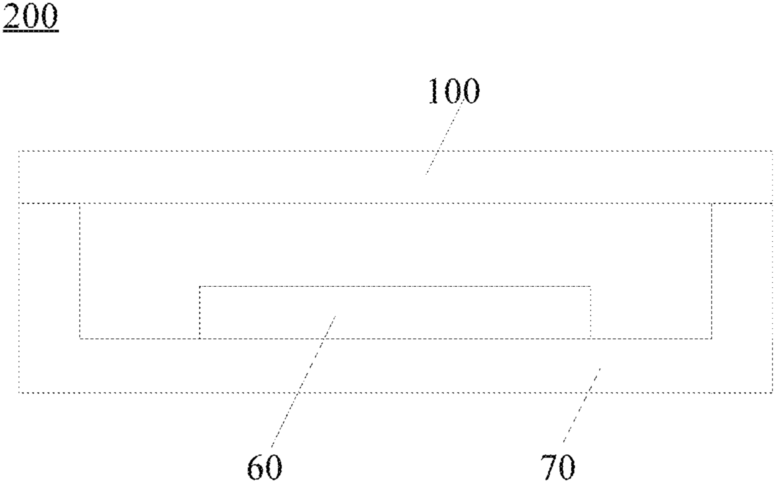
FIG. 5 is a schematic structural view of an electronic device according to some embodiments of the present disclosure.

Please refer to FIG. 5. FIG. 5 is a schematic structural view of an electronic device provided by another embodiment of the present disclosure. An electronic device 200 may include a display panel 100, a control circuit 60, and a housing 70. It should be noted that the electronic device 200 shown in FIG. 5 is not limited to the above-mentioned content, and may also include other devices, such as a camera, an antenna structure, a pattern unlocking module, and the like.

Specifically, the display panel 100 is disposed on the housing 70.

In one embodiment, the display panel 100 can be fixed to the housing 70, and the display panel 100 and the housing 70 form a closed space to accommodate the control circuit 60 and other devices.

In one embodiment, the housing 70 may be made of a flexible material, such as a plastic housing or a silicone housing.

Specifically, the control circuit 60 is assembled in the housing 70. The control circuit 60 may be a main board of the electronic device 200, and may be integrated with one, two or more of functional components, such as a battery, an antenna structure, a microphone, speaker, an earphone interface, universal serial bus interface, a camera, a distance sensor, an ambient light sensor, a receiver, and a processor.

The display panel 100 is assembled in the housing 70 and is electrically connected to the control circuit 60 to form a display surface of the electronic device 200. The display panel 200 may include a display area and non-display area. The display area is configured to display a screen of the electronic device 200 or for users' touch control. The non-display area can be used to set various functional components.

The electronic device includes, but is not limited to, mobile phones, tablet computers, computer monitors, game consoles, televisions, display screens, display panels, wearable devices, and other household appliances or household appliances with display functions.

Embodiments of the present disclosure provide a flexible substrate and a method of manufacturing the same, and an electronic device, each including a first flexible substrate, a porous film layer disposed on the first flexible substrate, and a second flexible substrate disposed on the porous film layer. The porous film layer is configured to increase adhesion between the first flexible substrate and the second flexible substrate. Since the porous film layer is added between the first flexible substrate and the second flexible substrate, the adhesion between the first flexible substrate and the second flexible substrate is increased, thereby avoiding a risk of separation or even fall off of a dual layer flexible substrate during a manufacturing process, and improving process stability of a display panel and a stripping yield of a flexible substrate.

The flexible substrate and the method of manufacturing the same, and the electronic device provided by the embodiments of the present disclosure are described in detail above. Specific examples are used in this article to describe the principle and implementation of the disclosure, and the description of the above examples is only used to help understand the disclosure. Furthermore, for those skilled in the art, according to the idea of the disclosure, there may be changes in the specific implementation and the scope of disclosure. Accordingly, the content of this specification should not be construed as a limitation to the disclosure.

What is claimed is:

1. A method of manufacturing a flexible substrate, comprising:
- forming a first flexible substrate on a glass substrate;
- forming a porous film layer on the first flexible substrate;
- forming a second flexible substrate on the porous film layer, wherein the porous film layer is configured to increase adhesion between the first flexible substrate and the second flexible substrate; and
- separating the first flexible substrate from the glass substrate,
- wherein a material of the porous film layer comprises polyimide/inorganic nanohybrid material.

2. The method of claim 1, wherein forming the porous film layer on the first flexible substrate comprises:
- coating a material of the porous film layer on the first flexible substrate; and
- performing a pre-curing process on the material of the porous film layer coated on the first flexible substrate.

3. The method of claim 2, wherein the pre-curing process is performed by pre-heating the material of the porous film layer at a temperature lower than 200° C.

4. The method of claim 2, wherein forming the second flexible substrate on the porous film layer comprises:
- coating a material of the second flexible substrate on a pre-cured material of the porous film layer; and
- performing a curing process on the material of the second flexible substrate and the pre-cured material of the porous film layer simultaneously.

5. The method of claim 4, wherein the curing process is performed by pre-heating the material of the second flexible substrate and the pre-cured material of the porous film layer at a temperature greater than 400° C.

6. The method of claim 1, wherein the inorganic nanohybrid material comprises at least one of titanium dioxide or silicon dioxide.

7. The method of claim 1, wherein the porous film layer has a thickness less than five microns.

8. The method of claim 1, wherein the porous film layer has a heat-resistant temperature greater than 500° C.

9. The method of claim 1, wherein the porous film layer has a porosity greater than 50%.

10. The method of claim 1, wherein the first flexible substrate has a thickness less than that of the second flexible substrate.

11. The method of claim 1, wherein each of the first flexible substrate and the second flexible substrate is made of yellow polyimide.

12. A method of manufacturing a flexible substrate, comprising:

forming a first flexible substrate on a glass substrate;

forming a porous film layer on the first flexible substrate;

forming a second flexible substrate on the porous film layer, wherein the porous film layer is configured to increase adhesion between the first flexible substrate and the second flexible substrate; and separating the first flexible substrate from the glass substrate, wherein the porous film layer comprises a molecular chain structure comprising ether bonds and siloxane segments.

13. The method of claim 12, wherein forming the porous film layer on the first flexible substrate comprises:

coating a material of the porous film layer on the first flexible substrate; and performing a pre-curing process on the material of the porous film layer coated on the first flexible substrate.

14. The method of claim 13, wherein the pre-curing process is performed by pre-heating the material of the porous film layer at a temperature lower than 200° C.

15. The method of claim 13, wherein forming the second flexible substrate on the porous film layer comprises:

coating a material of the second flexible substrate on a pre-cured material of the porous film layer; and performing a curing process on the material of the second flexible substrate and the pre-cured material of the porous film layer simultaneously.

* * * * *